United States Patent [19]

Konishi et al.

[11] 4,101,772
[45] Jul. 18, 1978

[54] ION-BEAM ETCHING METHOD AND AN APPARATUS THEREFOR

[75] Inventors: Fumiya Konishi, Toyonaka; Kenji Kusao, Osaka; Yoshiaki Yoshioka, Moriguchi, all of Japan

[73] Assignee: Matsushita Electric Industrial Co., Ltd., Kadoma, Japan

[21] Appl. No.: 759,870

[22] Filed: Jan. 17, 1977

[30] Foreign Application Priority Data

Jan. 19, 1976 [JP] Japan .................................. 51-5242

[51] Int. Cl.$^2$ ............................................. A61K 27/02
[52] U.S. Cl. ................................. 250/399; 250/492 B
[58] Field of Search ............... 250/396, 397, 398, 399, 250/492 B

[56] References Cited

U.S. PATENT DOCUMENTS

| 3,294,954 | 12/1966 | Ramsey | 250/396 |
| 3,377,506 | 4/1968 | Banas et al. | 250/397 |

Primary Examiner—Harold A. Dixon
Attorney, Agent, or Firm—Wenderoth, Lind & Ponack

[57] ABSTRACT

The present invention enables a decrease in etching velocity in an ion-beam etching system without decreasing the current density of the ion beam. The ion-etching is performed at a constant value of ion-beam current density and an increased partial pressure of oxygen or other suitable gas in the specimen chamber. The partial pressure of oxygen is increased until the intensity of a secondary ion-beam from the specimen reaches a saturation value. Under these conditions a stable reduced etching velocity is obtained, the value of which is determined by the ion-beam current density, the partial pressure of oxygen and the previously determined characteristics of the specimen.

6 Claims, 3 Drawing Figures

ION-BEAM ETCHING METHOD AND AN APPARATUS THEREFOR

BACKGROUND OF THE INVENTION

An ion-beam etching apparatus has heretofore been composed of three systems, an ion beam system including an ion source and a beam focusing section, an ion etching system including a beam scanner and a specimen chamber, and a vacuum exhaust system.

Generally, in a conventional ion beam processing system, 3 - 10 kV is applied on an ion coming from the ion source by means of an electrical lens; the ion is then drawn out, and thereafter, by means of the focusing lenses, the ion beam diameter and its profile are changed at the surface of a specimen.

FIG. 1 is a constructional diagram of a conventional ion beam etching apparatus, in which numeral 1 designates an argon gas entrance; 2, a thermal cathode; 3, the ion source section; 4, an anode; 5, a drawing-out electrode; 6, a focusing electrodes; 7, the beam focusing section for focusing the beam; 8, the ion beam system; 9, a variable slit; 10, the scanning electrodes; 11, vacuum exhaust system (A); 12, a gate valve; 13, the specimen chamber; 14, the specimen; (15), the specimen table; 16, vacuum system (B); 17, the ion etching system; and 18, the vacuum exhaust system.

Those are two methods of irradiating the ion beams onto the specimen surface, that is (1) irradiating the specimen with the ion beams uniformly spread and (2) scanning and irradiation with fine ion beams. The former method is used in etching a wide surface of the sample by spread ion beams, and the latter in ion beam milling. It is by this latter method that a wide flat surface may be obtained by way of etching while scanning with the ion beams.

The characteristics of the ion beam processing methods include: (a) very slight contamination by the residual gas because the operation is performed under a high degree of vacuum; (b) control of the angle of irradiation and the ion current; (c) a high-resolution pattern without side etching; and (d) a low etching rate.

In the fine processing technique employed in manufacturing electronic high density components, the surface or film etching techniques are important. Especially, techniques enabling the etching to be performed at low processing rates are necessary. If the conventional ion beam etching system is utilized for this purpose, the current density of the ion beam needs to be decreased. As the current density is decreased, the adsorption of the residual gas by the specimen increases; on extreme occasions, the effect is an increase in the amount of the residual gas adsorbed, rather than meeting the requirement for etching the surface of the workpiece. Moreover, high degrees of vacuum in the system are required. Since a conventional system is not supplied with a second ion monitor, it is not possible to check on the changes in the intensity of the secondary ion or the type of the secondary ion which is produced in concert with the etching. For this reason, the exact etching depth and the amount of the material left to be etched can not be determined.

SUMMARY OF THE INVENTION

It is an object of the present invention to provide an ion-beam etching apparatus which permits of etching a workpiece at a very low speed.

It is an another object of the present invention to provide an ion-beam etching apparatus which can recognize the exact etching depth while etching is performed.

It is a further object of the present invention to provide an ion-beam etching method which permits etching of a workpiece at a very low speed.

In accordance with the present invention, ion-beam etching is performed in which the current density of ion beam is kept at constant value and the partial pressure of gas introduced in the specimen chamber is increased until the intensity of a secondary ion beam from the specimen to be etched is saturated to a definite value.

DETAILED DESCRIPTION OF THE PREFERRED EMBODIMENT

Hereinafter, details of an embodiment of the present invention will be described.

Figure 2:
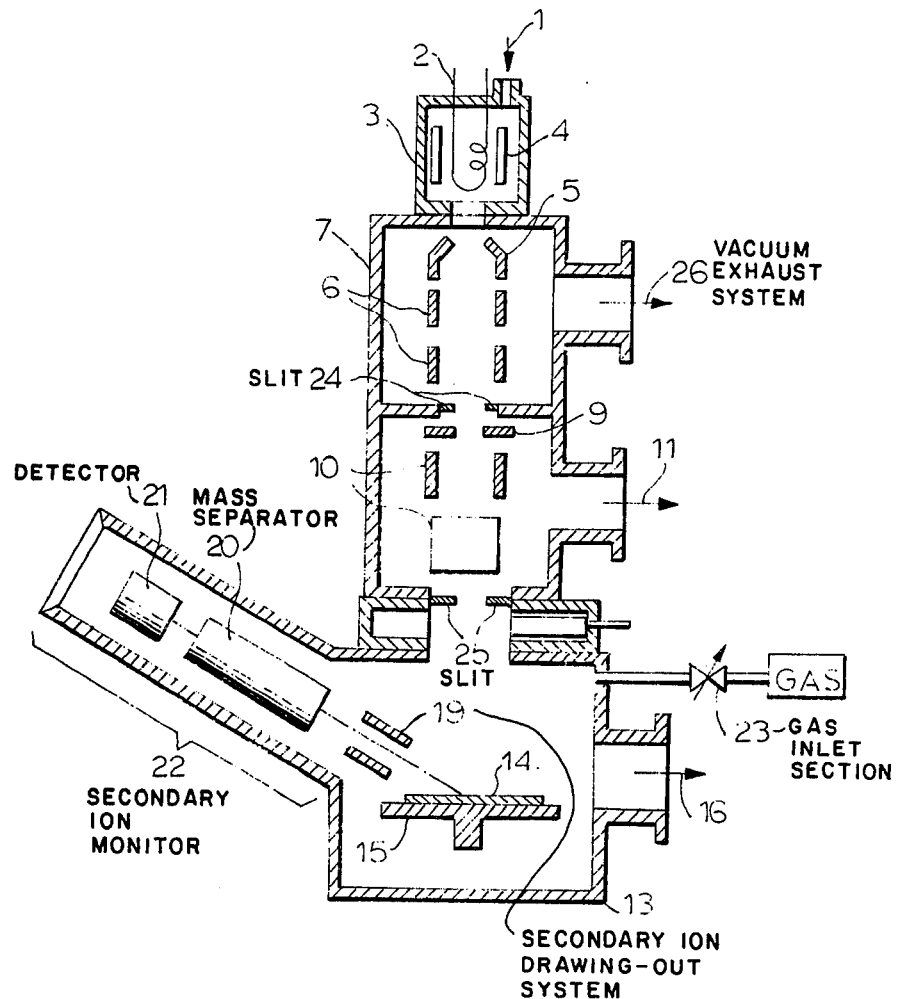
FIG. 2 is an explanatory diagram showing the construction of an ion beam etching apparatus according to this invention.

In the specimen chamber for holding therein a specimen to be etched, a gas inlet valve for introducing gas into the specimen chamber and a secondary ion monitor for monitoring secondary ions from the specimen are installed. Ion beam etching is performed by increasing the partial pressure of oxygen in the specimen chamber while keeping the current density of the ion beams constant, as shown in FIG. 2. Then, the etching velocity decreases as the intensity of the secondary ion is increased and saturated to a definite value. This phenomenon is utilized. Thus, it becomes possible to decrease the etching velocity, allowing only a small amount of the gas of one type to be adsorbed on the specimen surface without decreasing the current density, and also to achieve stable and easy control of the constant etching velocity. In this instance, the gas pressure which causes the change in the etching velocity should be varied with the type of the material to be etched and with the current density of the ion beam, and if numerous types of stable oxides exist, as is the case with some metals, the etching velocity and the intensity of the secondary ion undergo changes in two or three steps.

Figure 1:
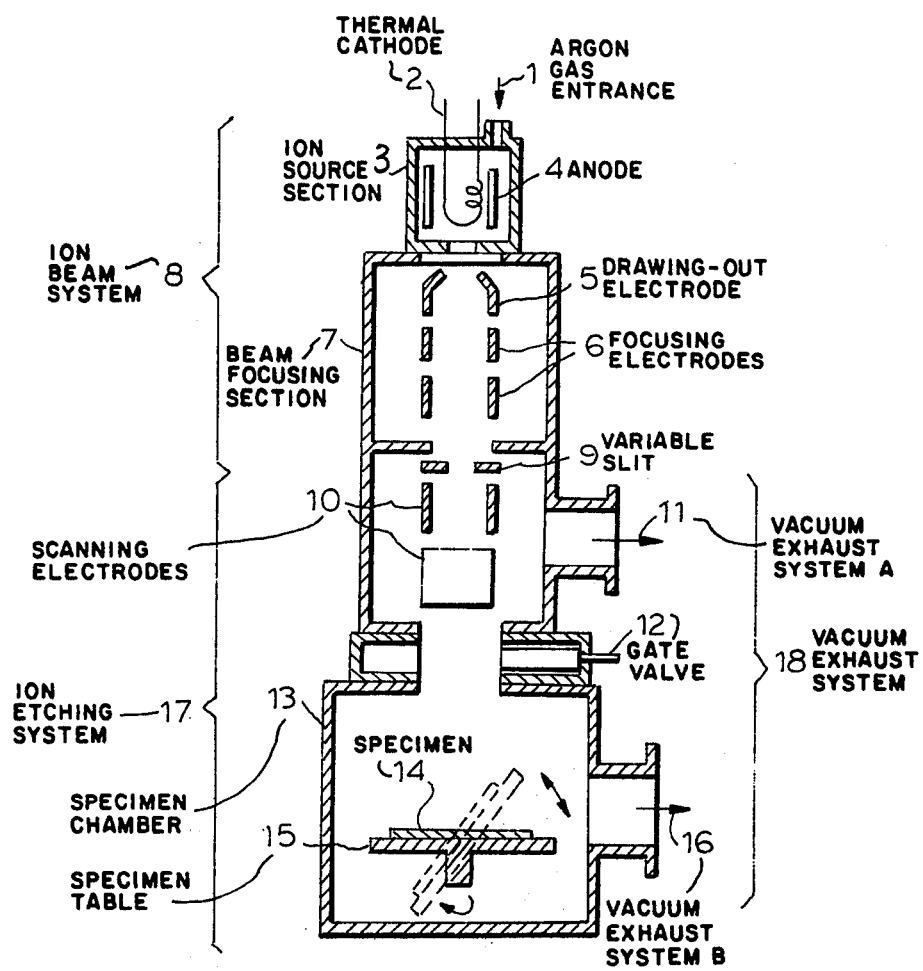
FIG. 1 is an explanatory diagram showing the construction of a conventional ion beam etching system.

Referring to FIG. 2, the present invention includes the following structures in addition to those found in the prior art as illustrated by FIG. 1; numeral 19 designates a secondary ion drawing-out system; 20, a mass separator; 21, a detector; 22, the secondary ion monitor; 23, a gas inlet section; 24 and 25, slits; and 26, a vacuum exhaust system.

Through the gas inlet section 23 attached to a specimen chamber 13, high purity gas such as oxygen or the like is introduced, up to a gas pressure of $1 \times 10^{-5}$ Torr. If this introduced gas is allowed to diffuse to the ion beam focusing section, the field of the static type lenses is altered; then, the current density changes and the beam diameter fluctuates, and as a consequence, the etching velocity can not be kept constant.

To overcome this difficulty narrow slits 24, and 25 are provided between the ion beam focusing section 7 and the beam scanning section and between the beam scanning section and the specimen chamber 13, and the exhaust system (C) 26 is separately attached to the ion beam focusing part 7, to perform differential pumping.

Thus, the gas pressure of the introduced gas is lower at a scanning electrode 10, as compared to the pressure in the specimen chamber 13 due to the existence of the slit 25, and the slit 24 makes the gas pressure lower in the beam focusing section 7 than at the scanning electrode 10. When the gas is introduced, the intensity of the secondary ion beam changes with the partial pressure of the gas. This is measured by the secondary ion monitor employing mass analyser 22 installed in the specimen chamber 13. If the correlation between the etching velocity and the intensity of the secondary ion beam from the component element of the material to be etched, has been established beforehand, the retardation of the etching velocity that occurs when the intensity as detected by the secondary ion monitor 22 becomes constant will be known. The intensity of the secondary ion beam is determined by the current density of the ion beam and the partial gas pressure. Furthermore, since the intensity of the secondary ion beam and the type of the secondary ion are altered as the metal or compound of the surface undergoes changes during the continuous etching, a check for the completeness of the etching of the object material may be made.

Accordingly, in the ion beam etching system above described, it is possible, with various types of high purity gases introduced into the specimen chamber 13, (a) to carry out the differential pumping especially to keep the degree of vacuum in the ion beam focusing system constant for averting of the fluctuation of the ion beam characteristic at the time of introducing the gas, and (b) to monitor the etching velocity which is determined by the two factors, the current density of the ion beam and the gas pressure, by measuring the intensity of the secondary ion beam of the component element of the material to be etched.

In the conventional apparatus, for the purpose of decreasing the etching velocity, the current density of the ion beam is decreased. Because the fluctuation of the etching velocity due to the adsorption of the residual gas and the change in the focusing condition due to the variation of the condition for forming the primary ion beam pose grave problems, the apparatus needs to be held under a high degree of vacuum (higher than $1 \times 10^{-9}$ Torr).

With the apparatus of the present invention, an ultimate degree of vacuum on the order of $1 \times 10^{-7}$ Torr is satisfactory, and the etching of the specimen surface can be carried out at a low velocity while keeping the current density of the ion beam high.

Figure 3:
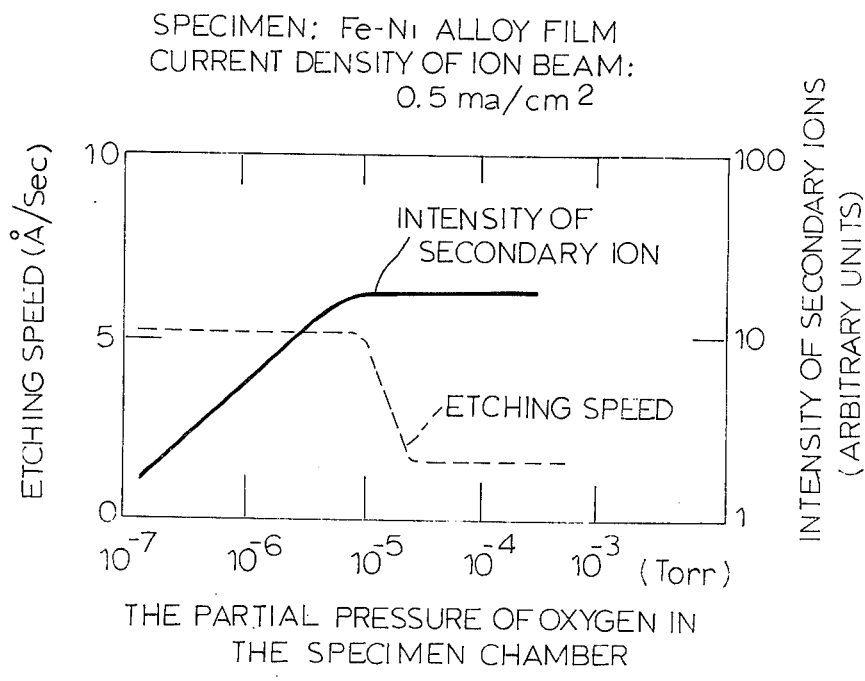
FIG. 3 is a graph correlating the partial pressure of oxygen in a specimen chamber, the etching velocity and the intensity of a secondary ion.

For example, when the oxygen gas is introduced at about $5 \times 10^{-5}$ Torr, with the current density of the ion beam held at 0.5 mA/cm², the etching velocity can be stabilized at a value reduced to $\frac{1}{3}$ of its original value as shown in FIG. 3, while forming only a very thin oxide film on the sample surface, this rate of reduction varying with the material to be etched and the type of the gas introduced.

Accordingly, this invention provides a favorable means for carrying out correct etching of a very thin layer. Moreover, the specified etching velocity may be obtained with stability and ease, even if the current density of the ion beam is changed a little, by monitoring the intensity of the secondary ions from the component element of the material to be etched, for different etching velocities. Furthermore, when etching a thin film layer, the intensity of the secondary ion is altered because of the change of the material at its interface with the supporting layer. Accordingly, by detecting the secondary ion from the component element of the lower layer, the completeness of the etching of the material of the upper layer may be ascertained.

As described in the foregoing, according to the present invention, the gas inlet section and the secondary ion beam monitoring section are installed in the specimen chamber; between this specimen chamber and the beam focusing section, means for changing the gas pressure, for example, the first slit between the processing compartment and the scanning electrode section, and the second slit between this scanning electrode section and the beam focusing section, are respectively provided, and at the beam focusing section, an exhaust system is attached, whereby favorable etching is achieved. Thus, this invention provides a commercially valuable method and apparatus for carrying out ion-beam etching.

What we claim is:

1. An ion-beam etching apparatus comprising:
   an ion source for producing a beam of ions;
   a beam focusing means aligned with the beam of ions from said ion source for focusing the beam from said ion source;
   a beam source chamber enclosing said ion source and said beam focusing means for prevention of the introduction of unwanted gases into the path of the beam of ions;
   a specimen chamber aligned with said beam focusing means and connected with said beam source chamber for prevention of the introduction of unwanted gases into the ion beam path and for holding a specimen to be etched by the beam from said beam focusing means;
   a vacuum exhaust means connected to said beam source chamber and said specimen chamber for removing gas from the path of the beam of ions;
   a gas introducing means connected to said specimen chamber for introducing gas into said specimen chamber; and
   an additional vacuum exhaust means connected to said beam source chamber for removing gas from the path of the beam of ions.

2. An ion-beam etching apparatus as claimed in claim 1, further comprising:
   a scanning means aligned with said beams of ions between said beam focusing means and said specimen chamber for scanning said beam of ions across the specimen; and
   gas retarding means between said specimen chamber and said scanning means and between said scanning means and said beam focusing means for slowing the diffusion of gas introduced by said gas introducing means from said specimen chamber to said beam source chamber.

3. An ion-beam etching apparatus as claimed in claim 1, wherein:
   said specimen chamber further comprises a secondary ion monitoring means for measuring the intensity of secondary ions emitted by the specimen.

4. An ion-beam etching apparatus as claimed in claim 1, wherein:
   said gas introducing means is means for introducing oxygen into said specimen chamber.

5. An ion-beam etching method, comprising:

irradiating a specimen with an ion-beam of constant current density;
monitoring the intensity of secondary ions emitted by the specimen; and
increasing the partial pressure of gas in the path of the ion-beam until the intensity of secondary ions emitted by the specimens saturates to a definite value.

6. An ion-beam method as claimed in claim 5, wherein said gas is oxygen.

* * * * *